United States Patent [19]
Logan

[11] Patent Number: 5,477,197
[45] Date of Patent: Dec. 19, 1995

[54] VOLTAGE CONTROLLED OSCILLATOR WITH IMPROVED VOLTAGE VERSUS FREQUENCY CHARACTERISTIC

[75] Inventor: Shawn M. Logan, Andover, Mass.

[73] Assignee: AT&T Corp., Murray Hill, N.J.

[21] Appl. No.: 327,763

[22] Filed: Oct. 24, 1994

[51] Int. Cl.⁶ .................................................. H03B 5/32
[52] U.S. Cl. ........................................ 331/158; 331/177 V
[58] Field of Search ............................ 331/36 C, 116 R, 331/116 FE, 158, 177 V; 332/128

[56] References Cited

U.S. PATENT DOCUMENTS

| | | | |
|---|---|---|---|
| 4,667,170 | 5/1987 | Lofgren et al. | 331/36 C |
| 4,853,655 | 8/1989 | Embree et al. | 331/116 FE |
| 4,887,053 | 12/1989 | Embree et al. | 331/116 FE |
| 4,970,472 | 11/1990 | Kennedy et al. | 331/25 |
| 4,973,922 | 11/1990 | Embree et al. | 331/108 D |

OTHER PUBLICATIONS

"The Current Dependency of Crystal Unit Resistance at Low Drive Level" Proceedings of the 25th Annual Symposium on Frequency Control Apr. 26–28, 1971, U.S. Army Electronics Command, Fort Monmouth, New Jersey pp. 139–147.

"A Simple Model for Quartz Resonator Low Level Drive Sensitivity" Forty–Fifth Annual Symposium on Frequency Control, L. Dworsky and R. Kinsman, Motorola, Inc., IEEE 1991, pp. 148–155.

Primary Examiner—Siegfried H. Grimm
Attorney, Agent, or Firm—Eugene S. Indyk

[57] ABSTRACT

An undesirable relationship between user applied input frequency control voltage and output frequency of a voltage controlled oscillator is counteracted by controlling the characteristics of an amplifier stage in the oscillator as a function of frequency control signal in addition to controlling the output frequency of the oscillator as a function of the capacitance of a user controlled variable capacitance in response to the frequency control signal.

3 Claims, 2 Drawing Sheets

TECHNIQUE TO LINEARIZE VARACTOR CONTROLLED OUTPUT FREQUENCY – CONTROL VOLTAGE CHARACTERISTIC BY CONTROLLING AMPLIFIER INPUT IMPEDANCE

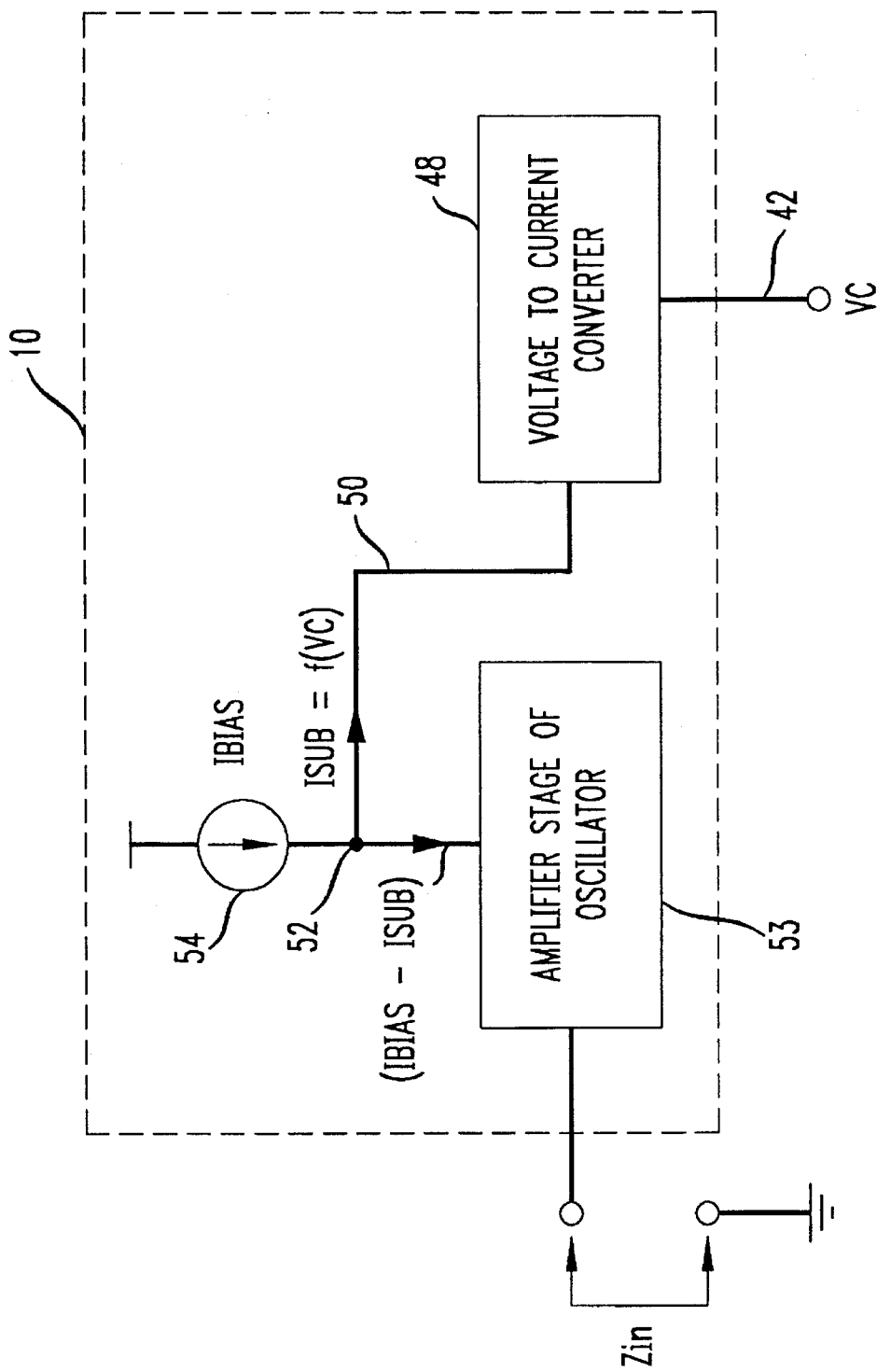

5,477,197

VOLTAGE CONTROLLED OSCILLATOR WITH IMPROVED VOLTAGE VERSUS FREQUENCY CHARACTERISTIC

TECHNICAL FIELD

This disclosure relates to oscillators, more particularly, to voltage controlled oscillators which have a desired relationship between a control voltage input and the frequency of oscillation, for example, a more linear relationship between a control voltage input and the frequency of oscillation.

BACKGROUND

The frequency of oscillation of typical voltage controlled oscillators is determined by the capacitance value of a varactor in a resonant stage in the oscillator. The value of the varactor capacitance is a function of the magnitude of a control voltage applied to the varactor. See, for example, U.S. Pat. Nos. 4,853,655, 4,887,053, and 4,973,922. The relationship between control voltage and varactor capacitance, and, therefore, the relationship between the control voltage and the frequency of oscillation, is not always desirable. For example, it is frequently desirable that the frequency of oscillation be a linear function of control voltage magnitude. Due to nonlinearities in the varactor—for example, nonlinearities at low signal levels—the oscillation frequency is not a linear function of control voltage magnitude. Many attempts have been made to satisfactorily linearize oscillation frequency vs control voltage magnitude. Techniques to provide a more linear transfer function between the control voltage and the output frequency include the use of external coils and restriction of the voltage range to linear regions of the varactor capacitance characteristic. These techniques increase manufacturing costs and reduce the range over which frequency may be controlled. In addition, these techniques are not easily implemented on a single integrated circuit.

SUMMARY

Applicant has surprisingly found that the functional relationship between control voltage magnitude and frequency of oscillation can be tailored to have a desired characteristic by not only seeking to vary the frequency of oscillation by controlling the voltage drive of a varactor, but also by varying the input impedance and gain of an amplifying stage in the oscillator as a function of the same or different control voltage as that which controls the capacitance of the varactor. For example, a single user applied frequency control voltage drives a varactor to produce a desired capacitance in a resonator stage in the oscillator and also drives a gain and impedance controlling element in an oscillator amplifier stage to compensate for undesirable nonlinearities in the relationship between varactor drive voltage and varactor capacitance.

This summary is meant to merely reflect one or more examples of the invention. The full scope of exclusionary right conferred by patent is defined in the claims.

BRIEF DESCRIPTION OF THE DRAWING

FIG. 2 is a schematic diagram of an example of an implementation of the voltage to reactance element shown in FIG. 1.

DETAILED DESCRIPTION

Figure 1:
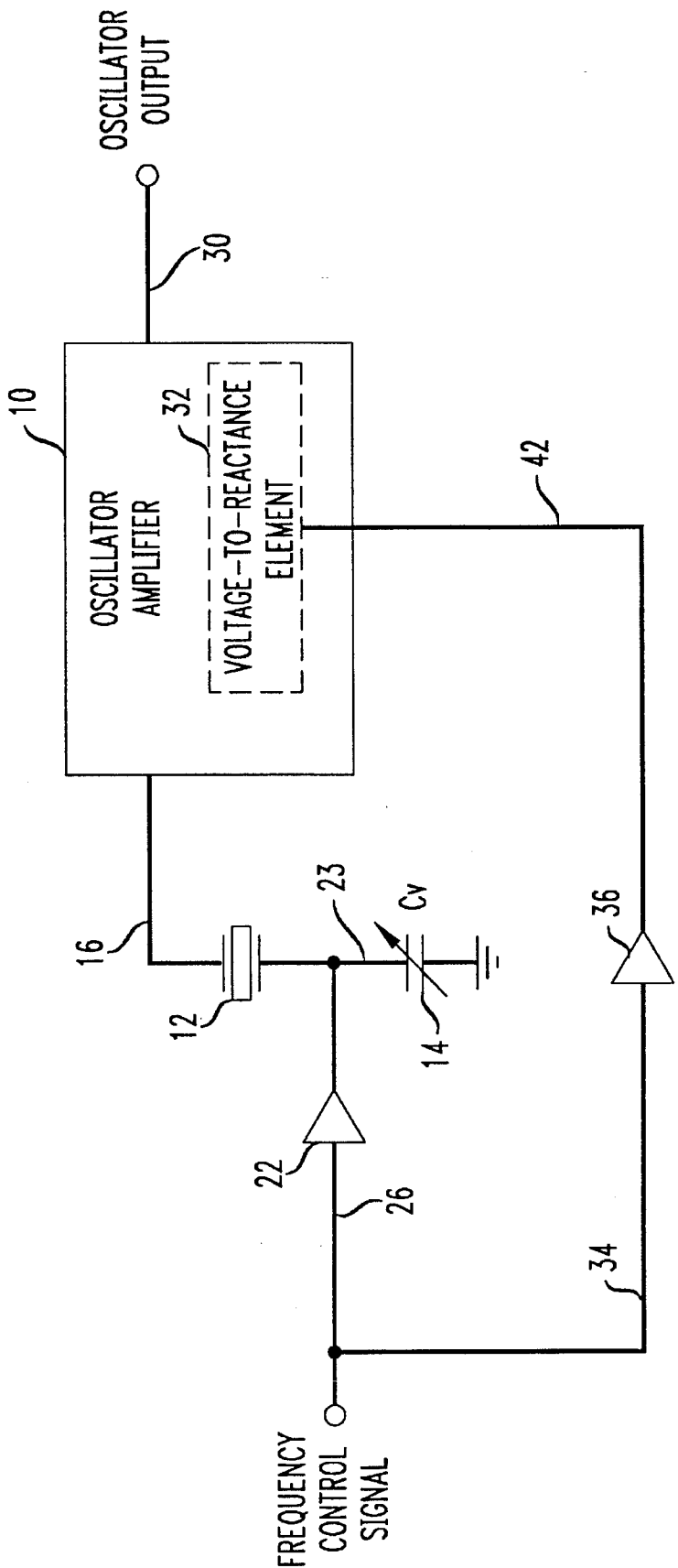
FIG. 1 is a schematic diagram of one example of a voltage controlled oscillator in accordance with this invention.

FIG. 1 shows an example of a voltage controlled oscillator which has a desired relationship between frequency of oscillation and user applied control voltage input in accordance with this invention. The oscillator of FIG. 1 comprises a resonator stage comprising a resonant element 12 such as a piezoelectric crystal in series with a variable capacitance 14 such as a varactor diode. The resonator stage is connected by way of a lead 16 to the input of an oscillator amplifier 10 which produces oscillatory output on lead 30. The oscillator amplifier 10 contains an element 32, such as a voltage to reactance element, which determines or influences the gain and input impedance of the amplifier 10.

An applied frequency control signal on lead 26 is supplied to the node 23 between the resonator element 12 and variable capacitance 14. The magnitude of the frequency control signal on lead 26 represents a desired frequency of oscillation for the circuit of FIG. 1. The frequency control signal as amplified or attenuated by an amplifier 22 constitutes a drive voltage for the variable capacitance. The value of the capacitance of element 14 is related to the magnitude of the drive voltage. The value of the capacitance determines the frequency at which the circuit of FIG. 1 achieves resonance and, therefore, determines the frequency of the oscillator output on lead 30.

The frequency of oscillation, however, may not be a desired function of the magnitude of the frequency control signal. For example, at low signal magnitudes, the capacitance of element 14 may not be a linear function of drive level.

The input impedance of the amplifier 10 in conjunction with the impedances of the resonant element 12 and the variable capacitance 14 form a resonant circuit. Changing the input impedance of the amplifier 10, such as by changing the reactive component of the input impedance as a function of the frequency control signal as in FIG. 1, will change the frequency at which the circuit of FIG. 1 achieves resonance and thereby the frequency at which the circuit of FIG. 1 will oscillate. The relationship between oscillation frequency and frequency control signal magnitude may be changed or trimmed by controlling the characteristics of the oscillator amplifier 10 to compensate for undesirable characteristics in the frequency control signal versus capacitance relationship in the varactor. This may be accomplished by directing the same frequency control signal, or a different frequency control signal, to an amplifier 36 on line 34. The amplifier 34 provides a predetermined amplification or attenuation of signals appearing on line 34. The output of the amplifier is directed to a control element 32, which may be a voltage to reactance element, in the oscillator 10, which controls the input impedance of the amplifier, the frequency at which resonance occurs, and thus the output frequency of the oscillator. The control path involving the frequency control signal on line 34 through amplifier 36 and voltage to reactance element 32 is configured so that undesirable characteristics in the untrimmed voltage versus frequency relationship are counteracted and a desirable characteristic is obtained, such as a linear voltage versus output frequency relationship.

Any element capable of controlling the input impedance of the amplifier 10 to appropriately change or trim the voltage vs. frequency characteristic may be used as the element 32 in the circuit of FIG. 1. For example, as shown in FIG. 2, the frequency control signal used during oscillation may control a bias current in an amplification stage 53 in the amplifier 10 to provide the required control of input impedance. In FIG. 2, the signal on line 42, which is the same as the signal on line 42 in FIG. 1, is directed to an input of a voltage to current converter 48 which produces a current output on line 50 which is related to the magnitude of the signal on line 42, for example, a current output which is substantially proportional to the input on line 42. The current on line 50 is either added to or subtracted from a node 52 in the amplification stage 10, as needed. The node 52 also receives bias current from a constant current source 54. The actual level of bias current in the amplification stage 10 thus is the bias current from source 54 modified by the current produced by the voltage to current converter 48. The input impedance of the amplifier 10, and thus the oscillation frequency of the circuit of FIG. 1, thus is controlled as a function of frequency control signal on line 26 to provide a desirable voltage vs frequency characteristic for the circuit of FIG. 1.

Although the examples of the invention shown in FIGS. 1 and 2 are described as involving the control of the varactor and the amplifier input impedance determining element 32 by the same frequency control signal, they may also be controlled by different control signals.

I claim:

1. A voltage controlled oscillator, comprising:

a resonator stage having a crystal resonator and a variable capacitance;

an amplifier having a predetermined gain and input impedance connected to the resonator stage for producing a predetermined output frequency of oscillation;

a first input for receiving a frequency control signal;

a means responsive to the first input for applying a drive voltage to the variable capacitance to control its capacitance and the output frequency of oscillation;

a second input for receiving the frequency control signal;

a means responsive to the second input for applying a frequency controlling input to the amplifier to create a desired relationship between the magnitude of the frequency control signal and the frequency of oscillation.

2. The voltage controlled oscillator of claim 1, in which the means responsive to the second input is such that nonlinearities in a relationship between drive voltage and the capacitance of the variable capacitor are counteracted.

3. A method of controlling an output frequency of a voltage controlled oscillator, comprising the steps of:

applying a control voltage to a varactor which has a capacitance varying as a function of the magnitude of the control voltage and which influences an output frequency of the voltage controlled oscillator as a function of the magnitude of the control voltage; and changing the output frequency of the oscillator as a function of the control voltage by changing a predetermined characteristic of an amplification stage in the oscillator to produce a desired output frequency versus control voltage magnitude for the oscillator.

\* \* \* \* \*